United States Patent [19]

Staudinger et al.

[11] Patent Number: 5,477,137
[45] Date of Patent: Dec. 19, 1995

[54] PROBEABLE SUBSTRATE SUBSTITUTE FOR A CALIBRATION STANDARD AND TEST FIXTURE

[75] Inventors: Joseph Staudinger, Gilbert; John M. Golio; Warren L. Seely, both of Chandler, all of Ariz.

[73] Assignee: Motorola, Inc., Schaumburg, Ill.

[21] Appl. No.: 955,967

[22] Filed: Oct. 2, 1992

[51] Int. Cl.[6] .................................................. G01R 19/10
[52] U.S. Cl. ........................................ 324/158.1; 333/246
[58] Field of Search ............................ 324/158 R, 158 F, 324/73.1, 158 P, 765; 333/246, 248, 247; 361/778, 790, 779, 792; 174/261; 439/55, 60, 66, 70; 257/691, 676

[56] References Cited

U.S. PATENT DOCUMENTS

| | | | |
|---|---|---|---|
| 3,155,881 | 11/1964 | Jean | 361/761 |
| 3,897,126 | 7/1975 | Frances et al. | 439/55 |
| 3,979,671 | 9/1976 | Meeker et al. | 324/158 F |
| 4,677,530 | 6/1987 | Mamiya et al. | 361/792 |
| 4,768,004 | 8/1988 | Wilson | 333/246 |
| 4,897,601 | 1/1990 | Hirsch et al. | 324/158 F |
| 4,912,402 | 3/1990 | Angelucci et al. | 324/158 F |
| 4,980,636 | 12/1990 | Romanofsky et al. | 324/158 F |
| 4,994,737 | 2/1991 | Carlton et al. | 324/158 R |
| 5,235,208 | 8/1993 | Katoh | 333/247 |
| 5,294,897 | 3/1994 | Notani et al. | 257/676 |

*Primary Examiner*—Vinh P. Nguyen
*Attorney, Agent, or Firm*—Jeffrey D. Nehr

[57] ABSTRACT

A method and apparatus for a probeable substrate substitute for a calibration standard and test fixture. The probestrate includes a dielectric substrate having first and second dielectric substrate surfaces and at least one conductive via hole through the dielectric substrate from the first dielectric substrate surface to the second dielectric substrate surface. A first metalized layer is in contact with the first dielectric substrate surface and the at least one conductive via hole. A second metalized layer is in contact with a first portion of the second dielectric substrate surface and with the at least one conductive via hole. The first and second test ports contact a second portion of the second dielectric substrate surface. An electronic device can be connected to the first and second test ports with bond wires for characterization via contact of the first and second test ports with standard test station equipment.

13 Claims, 2 Drawing Sheets

PROBEABLE SUBSTRATE SUBSTITUTE FOR A CALIBRATION STANDARD AND TEST FIXTURE

BACKGROUND OF THE INVENTION

This invention relates in general to the field of test fixtures and calibration standards, and, in particular, to a probeable substrate substitute for a calibration standard and test fixture.

Accurately measuring and characterizing devices and circuits has often proven difficult since such components do not connect directly with measurement equipment. A test fixture is often needed to transition between the device and test set. Hence, an electrical measurement of a device in a test fixture includes both device parameters as well as fixturing effects. To determine only the device parameters, the fixture must be characterized and its contribution mathematically removed from the overall measurement. Since such fixturing is complicated and contains electrical discontinuities, it is difficult and sometimes impossible to effectively characterize fixture parameters. Such limitations on the effective characterization of fixture parameters, in turn, place limitations on how accurately device parameters can be determined.

In some microwave monolithic integrated circuits (MMICs), the devices or circuits can be fabricated with probe connections which allow commercial test equipment to probe for electrical parameters directly on the device. Probeable devices improve the accuracy of determining device parameters since the probes can be accurately calibrated and their effects removed from the measured data. Unfortunately, however, many devices, including schottky barrier diodes, gallium arsenide (GaAs) metal-schottky field effect transistors (GaAs MESFETs), and certain other MMICs do not allow measurement by direct probing. The only way to measure the electrical characteristics of unprobeable devices is to measure them as they are embedded in the fixture.

Thus, what is needed is a practical, economical method for accurately characterizing devices which are unsuitable for direct probing. It is desirable to provide for a calibration standard and test fixture substitute which includes RF connections which allow probe contact with commercial test equipment. It is additionally desirable if typical calibration standards, e.g., load-reflect-through, through-reflect-line, etc. are incorporated into the probeable substrate.

SUMMARY OF THE INVENTION

Accordingly, it is an advantage of the present invention to provide a new and improved method and apparatus for a probeable substrate substitute for a calibration standard and test fixture. The method and apparatus is easy to apply to a variety of devices, whether packaged or unpackaged, and is compatible for attaching most microwave devices and circuits. The probestrate method and apparatus provides an accurate fixture characterization at a low cost. Many measurement uncertainties are removed using this approach, and measurement ease is enhanced. The method and apparatus are simple, flexible, and fast, while providing higher frequency measurement with greater accuracy than with other techniques.

To achieve these advantages, a probeable substrate substitute for a calibration standard and test fixture is contemplated which includes a dielectric substrate having first and second dielectric substrate surfaces and at least one conductive via hole through the dielectric substrate from the first dielectric substrate surface to the second dielectric substrate surface; a first metalized layer in contact with the first dielectric substrate surface and the at least one conductive via hole; a second metalized layer in contact with a first portion of the second dielectric substrate surface and with the at least one conductive via hole; and first and second test ports in contact with a second portion of the second dielectric substrate surface, such that the electronic device can be connected to the first and second test ports for characterization via the first and second test ports.

To further achieve these advantages, a method for calibrating an electronic device is contemplated, the method comprising the steps of providing a probestrate having a dielectric substrate, first and second test ports and a first metalized layer on a first dielectric substrate surface of the dielectric substrate, at least one metalized plated through via, and a second metalized surface covering a second surface of the dielectric substrate, placing the electronic device on the probestrate between the first test port and the second test port, coupling bond wires between the device and the first and second test ports, and probing the test ports.

The above and other features and advantages of the present invention will be better understood from the following detailed description taken in conjunction with the accompanying drawings.

DETAILED DESCRIPTION OF THE PREFERRED EMBODIMENT

While discussed in a MMIC setting, the following method and apparatus described is applicable to RF, microwave, or communications electronics in general.

Figure 1:
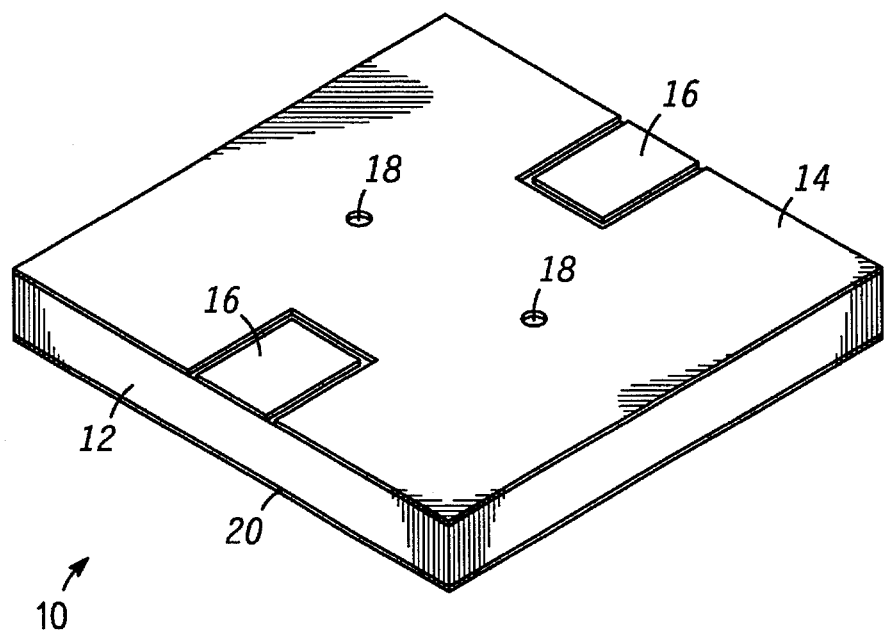
In FIG. 1, there is shown a preferred embodiment in accordance with the present invention of a probeable substrate (probestrate) substitute for a calibration and test fixture.

In FIG. 1, there is shown a probeable substrate substitute, or probestrate 10, as a microwave calibration and test fixture which can be used in conjunction with a typical MMIC coplanar microwave probe station to calibrate or characterize an electronic device. FIG. 1 shows a dielectric substrate 12, which can be composed of alumina. FIG. 1 also shows metalized bottom layer 20 and metalized top layer 14, with each layer immediately adjacent to the top and bottom surfaces, respectively, of dielectric substrate 12. The top and bottom surfaces of the dielectric substrate 12 are substantially parallel in preferred embodiment. The metalized layers 20 and 14 in the preferred embodiment are comprised of gold, but other conductors can be substituted. The metalized layer 14 does not completely cover the top surface of the dielectric substrate 12.

FIG. 1 also shows via holes 18 which are conductive. The conductive via holes electrically couple the metalized layers 20 and 14. The via holes 18 provide electrical grounding as well as a convenient thermal path. In the preferred embodiment of FIG. 1, the via holes 18 are plated with gold. Micro Strates in Camarillo, Calif. is a supplier of plated through conductive vias in alumina substrates.

Test ports 16 in FIG. 1 comprise metalized surface coplanar transmission lines and are immediately adjacent to portions of the top surface of dielectric substrate 12 which are not covered by metalized layer 14. In the preferred embodiment of FIG. 1, the two test ports 16 are identical in shape, are laid out on opposite sides of the top surface of dielectric substrate 12 against opposite edges of the top surface of the dielectric substrate 12, and are spaced apart from metalized surface 14 by a slight gap. A variety of test port shapes and locations can be accommodated so long as the test ports 16 can be contacted with a MMIC probe.

In the FIG. 1 embodiment, the metalized layer 14 and the test ports 16 together substantially cover the top surface of the dielectric substrate 12. A narrow gap separates each of the test ports 16 from the metalized layer 14, the gap being determined by the materials and dimensions of dielectric substrate 12.

Figure 2:
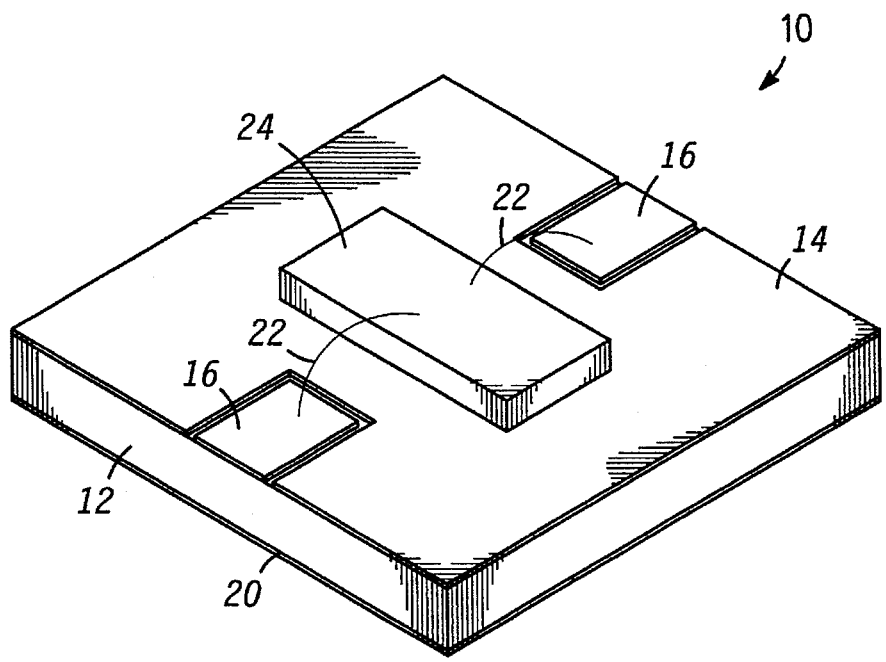
In FIG. 2, there is shown an electrical device positioned on and connected to the probestrate of FIG. 1.

FIG. 2 illustrates the probestrate 10 of FIG. 1 in use for characterizing a device. Reference numerals in FIG. 2 correspond to the same components as described and referenced in the description of FIG. 1 above. In addition, FIG. 2 illustrates device 24, which is a discrete device to be characterized and is positioned on metalized surface 14, and bond wires 22, which couple the device 24 to test ports 16.

To obtain accurate measurements such as scattering parameters of device 24, the entire system, including the probe station and network analyzer can be calibrated to establish a reference plane at the probe tips using standard techniques. The techniques utilized for calibrating network analyzer systems for probeable MMIC circuits is easily applied for the probestrate 10. With the system calibrated, the measured S-parameters consist of the device 24, bond wires 22 on the input and output, as well as very short coplanar transmission lines (test ports 16 in FIGS. 1 and 2). The undesired contributions of the bond wires 22 and test ports 16 to the overall measurement are relatively small and can further be de-embedded if desired.

In operation in FIG. 2, the method for calibrating or characterizing an electronic device comprises the steps of providing the probestrate 10, placing the device 24 on the probestrate 10 between the test ports 16 (i.e., on the first metalized layer 14 between the test ports 16), coupling bond wires 22 between the device 24 and the test ports 16, and probing the test ports 16 with standard test station probe equipment.

Figure 3:
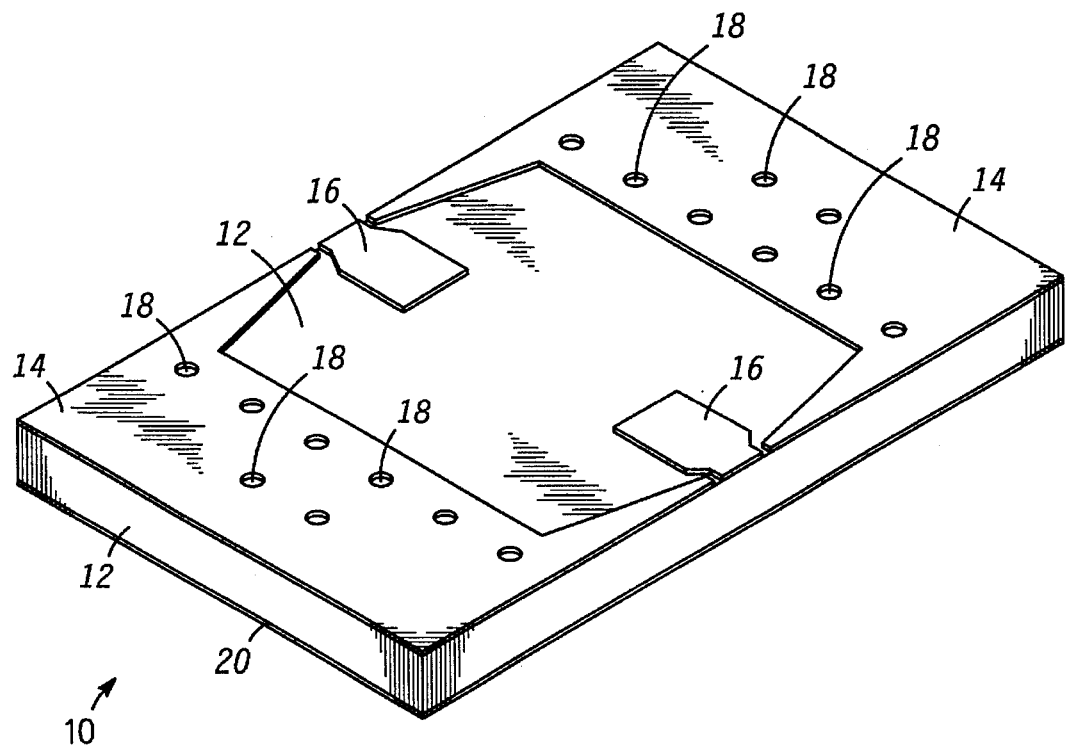
In FIG. 3, there is shown a second preferred embodiment in accordance with the present invention of a probestrate substitute for a calibration and test fixture.

FIG. 3 illustrates an alternative embodiment of a device for the calibration or characterization of an electronic device in accordance with the present invention. FIG. 3 shows a dielectric substrate 12, which can be composed of alumina. FIG. 3 also shows metalized bottom layer 20 and metalized top layer 14, with each layer immediately adjacent to the top and bottom surfaces, respectively, of dielectric substrate 12. The top and bottom surfaces of the dielectric substrate 12 are substantially parallel in this alternate preferred embodiment. The metalized layers 20 and 14 in the alternative preferred embodiment are comprised of gold, but, as in the previous embodiment, other conductors can be substituted. The metalized layer 14 covers significantly less of the top surface of the dielectric substrate 12 than the first embodiment in FIG. 1, allowing for testing of packaged devices. Packaged devices to be characterized can be placed on the surface of dielectric substrate 12 between test ports 16 in this alternate embodiment.

FIG. 3 shows via holes 18 which are coated with metal to be conductive. As in the previous described embodiment, the conductive via holes electrically couple the metalized layers 20 and 14 and provide electrical grounding as well as a convenient thermal path. In the preferred embodiment of FIG. 3, the via holes 18 are plated with gold.

Test ports 16 in FIG. 3 comprise metalized surface coplanar transmission lines and are immediately adjacent to portions of the top surface of dielectric substrate 12 which are not covered by metalized layer 14. The two test ports 16 are identical in shape, are laid out on opposite sides of the top surface of dielectric substrate 12 against opposite edges of the top surface of the dielectric substrate 12, and are separated by an expanse of the top surface of dielectric substrate 12. As in the embodiment in FIG. 1, a variety of test port shapes and locations can be accommodated as test ports 16 in FIG. 3, so long as the test ports 16 can be contacted with a MMIC probe.

Figure 4:
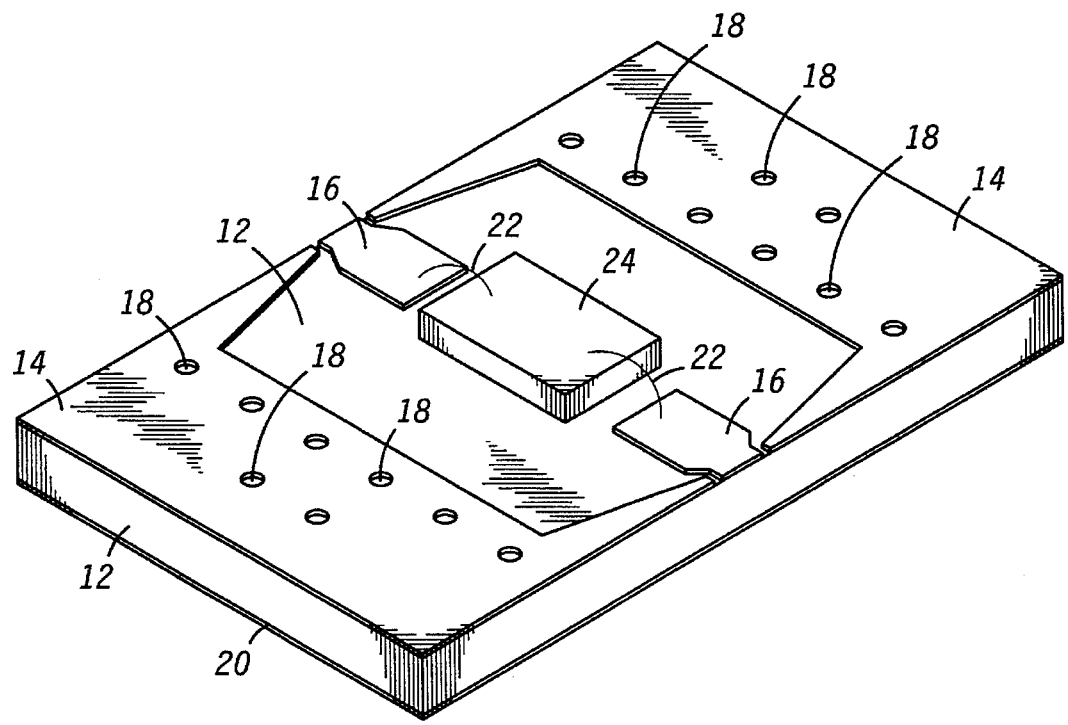
In FIG. 4, there is shown an electrical device positioned on and connected to the probestrate of FIG. 3.

FIG. 4 illustrates the probestrate 10 of FIG. 3 in use for characterizing a device. Reference numerals in FIG. 4 correspond to the same components as described and referenced in the description of FIG. 3 above. In addition, FIG. 4 illustrates device 24, which is a discrete device positioned on dielectric substrate 12, and bond wires 22, which couple the device 24 to test ports 16. Flat leads, ground leads, surface mounting, or other methods can be used to couple the device 24 to test ports 16.

The techniques utilized for calibration network analyzer systems for probeable MMIC circuits can easily be applied for the alternate embodiment of probestrate 10. As before, with the system calibrated, the measured S-parameters consist of the device 24, bond wires 22 on the input and output, as well as very short coplanar transmission lines (test ports 16). The undesired contributions of the bond wires 22 (or package leads) and test ports 16 to the overall measurement are relatively small and can further be de-embedded if desired.

In operation in FIG. 4, the method for calibrating or characterizing an electronic device comprises the steps of providing the probestrate 10, placing the device 24 on the probestrate 10 between the test ports 16 (i.e., on the top surface of the dielectric substrate 12 between test ports 16), coupling bond wires 22 between the device 24 and the test ports 16, and probing the test ports 16 with standard test station probe equipment.

The validity of the probestrate 10 concept has been examined by measuring several types of discrete microwave components. For example, the S-parameters of a discrete 0.5×300 micrometer GaAs MESFET were evaluated using the probestrate 10 from 1 to 18 GHz. The measured results, which include measurements including the effects of the two bond wire 22 connections and the short coplanar transmission lines (test ports 16) are in good agreement with published results and, more importantly, no undesired resonances due to the fixturing were detected over the frequency range. When a bond wire 24 connected between the two test ports 16 was measured, the probestrate 10 appeared to be resonant free over 1 to 18 GHz. The probestrate 10 appears to be useful to beyond 60 GHz.

The probestrate can be applied to other microwave devices. For example, the method and apparatus could be useful to characterize bipolar transistors where the bottom die surface forms the collector or emitter and is not grounded. In such a situation, the probestrate pattern would be altered to allow probe contact with the desired part of the die.

Thus, a method and apparatus for a probeable substrate substitute for a calibration and test fixture has been described which overcomes specific problems and accomplishes certain advantages relative to prior art methods and mechanisms. The improvements over known technology are significant. The method and apparatus is easy to apply to a variety of devices, whether packaged or unpackaged, and is compatible for attaching most microwave devices and circuits. The probestrate method and apparatus provides an accurate fixture characterization. Many measurement uncertainties are removed using this approach, and measurement ease is enhanced. The method and apparatus are simple, flexible, and fast, while providing higher frequency measurement with greater accuracy that with other techniques. Whereas a device characterization with the method and apparatus disclosed may have required a person one day to fabricate using perhaps ten dollars of fixture parts, the method and apparatus disclosed herein may only require use of a ready-made 25 cent probestrate for characterization. The probestrate approach allows the use of commercial probe station equipment to measure by probing microwave devices which do not contain probe pads. Commercial probe station equipment is available through suppliers such as Cascade Microtech, Inc. in Beaverton, Oreg.

Thus, there has also been provided, in accordance with an embodiment of the invention, a method and apparatus for a probeable substrate substitute for a calibration and test fixture that fully satisfies the aims and advantages set forth above. While the invention has been described in conjunction with specific embodiments, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. A probeable substrate for receiving an electronic device, the probeable substrate comprising:

a dielectric substrate having first and second dielectric substrate surfaces and at least one conductive via hole through the dielectric substrate from the first dielectric substrate surface to the second dielectric substrate surface;

a first metalized layer in contact with the first dielectric substrate surface and the at least one conductive via hole;

a second metalized layer in contact with a first portion of the second dielectric substrate surface and in contact with the at least one conductive via hole; and first and second test ports in contact with a second portion of the second dielectric substrate surface; wherein the electronic device is connected to the first and second test ports for probing via the first and second test ports.

2. A probeable substrate as claimed in claim 1, wherein the first and second dielectric substrate surfaces are substantially parallel.

3. A probeable substrate as claimed in claim 1, wherein the first and second test ports comprise coplanar transmission lines.

4. A probeable substrate as claimed in claim 1, wherein the electronic device is a microwave monolithic integrated circuit (MMIC) device.

5. A probeable substrate as claimed in claim 1, wherein the second metalized layer and the first and second test ports substantially cover the second dielectric substrate surface.

6. A probeable substrate as claimed in claim 5, wherein the second metalized layer and the first and second test ports substantially cover the second dielectric substrate surface except for a first gap between the first test port and the second metalized layer and a second gap between the second test port and the second metalized layer, where dimensions of the first and second gaps are determined by the material and dimensions of the probeable substrate and the electronic device is placed on the second metalized layer between the first and second test ports during probing.

7. A probeable substrate as claimed in claim 1, wherein the second metalized layer does not extend between the first and second test ports and the electronic device is placed on the second dielectric substrate surface during probing.

8. A test fixture for probing an integrated circuit comprising:

a dielectric substrate having first and second dielectric substrate surfaces and at least one conductive via hole through the dielectric substrate from the first dielectric substrate surface to the second dielectric substrate surface;

a first metalized layer in contact with the first dielectric substrate surface and in contact with the at least one conductive via hole;

a second metalized layer in contact with a first portion of the second dielectric substrate surface and in contact with the at least one conductive via hole; and first and second test ports in contact with a second portion of the second dielectric substrate surface; wherein the integrated circuit is connected to the first and second test ports for probing via the first and second test ports.

9. A test fixture as claimed in claim 8, wherein the first and second dielectric substrate surfaces are substantially parallel.

10. A test fixture as claimed in claim 8, wherein the first and second test ports comprise coplanar transmission lines.

11. A test fixture as claimed in claim 8, wherein the electronic device is a microwave monolithic integrated circuit (MMIC) device.

12. A test fixture as claimed in claim 8, wherein the second metalized layer and the first and second test ports substantially cover the second dielectric substrate surface except for a first gap between the first test port and the second metalized layer and a second gap between the second test port and the second metalized layer, where dimensions of the first and second gaps are narrower than dimensions of the test fixture; and the electronic device is placed on the second metalized layer between the first and second test pods during probing.

13. A test fixture as claimed in claim 8, wherein the second metalized layer does not extend between the first and second test ports and the electronic device is placed on the second dielectric substrate surface during probing.

* * * * *

UNITED STATES PATENT AND TRADEMARK OFFICE
CERTIFICATE OF CORRECTION

PATENT NO. : 5,477,137
DATED : December 19, 1995
INVENTOR(S) : Joseph Staudinger et al.

It is certified that error appears in the above-indentified patent and that said Letters Patent is hereby corrected as shown below:

In column 6, claim 12, line 55, delete "pods" and insert --ports--.

Signed and Sealed this

Sixteenth Day of April, 1996

Attest:

BRUCE LEHMAN

Attesting Officer         Commissioner of Patents and Trademarks